(12) United States Patent
Han et al.

(10) Patent No.: US 12,745,543 B2
(45) Date of Patent: Sep. 22, 2026

(54) DISPLAY MODULE, DISPLAY APPARATUS AND METHOD FOR MANUFACTURING THE SAME

(71) Applicant: BOE TECHNOLOGY GROUP CO., LTD., Beijing (CN)

(72) Inventors: Ziang Han, Beijing (CN); Chunyan Xie, Beijing (CN); Ziyu Zhang, Beijing (CN); Song Zhang, Beijing (CN); Xiongnan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 980 days.

(21) Appl. No.: 17/782,750

(22) PCT Filed: May 17, 2021

(86) PCT No.: PCT/CN2021/094054

§ 371 (c)(1),
(2) Date: Jun. 6, 2022

(87) PCT Pub. No.: WO2022/241602

PCT Pub. Date: Nov. 24, 2022

(65) Prior Publication Data

US 2024/0164194 A1 May 16, 2024

(51) Int. Cl.
*H10K 59/80* (2023.01)

(52) U.S. Cl.
CPC ....... *H10K 59/8722* (2023.02); *H10K 59/873* (2023.02); *H10K 59/875* (2023.02); *H10K 59/8792* (2023.02); *H10K 59/8793* (2023.02)

(58) Field of Classification Search
CPC .. H10K 59/126; H10K 59/873; H10K 59/875; H10K 59/8722; H10K 59/8792
See application file for complete search history.

(56) References Cited

U.S. PATENT DOCUMENTS

2020/0212370 A1* 7/2020 Ye ........................ H10K 59/873
2020/0321561 A1 10/2020 Park et al.
(Continued)

FOREIGN PATENT DOCUMENTS

CN 108681131 A 10/2018
CN 109935619 A 6/2019
(Continued)

OTHER PUBLICATIONS

CN 110922916 translation (Year: 2020).*
(Continued)

*Primary Examiner* — Leonard Chang
*Assistant Examiner* — Hajar Kolahdouzan
(74) *Attorney, Agent, or Firm* — XSENSUS LLP

(57) ABSTRACT

A display module has a functional device arrangement region and a main display region; the functional device arrangement region is provided with a mounting hole therein, and the functional device arrangement region includes a reserved region; a side wall of the mounting hole is of one of a step-shaped structure and a protrusion-depression structure. The display module includes a display panel, a first light-shielding pattern disposed on a light-exit side of the display panel, an adhesive layer disposed on a side of the first light-shielding pattern away from the display panel and a second light-shielding pattern covering at least the side wall of the mounting hole; an orthogonal projection of the first light-shielding pattern on the display panel substantially coincides with the reserved region of the display panel; the mounting hole penetrates the display panel, the first light-shielding pattern and the adhesive layer.

19 Claims, 7 Drawing Sheets

(56) References Cited

U.S. PATENT DOCUMENTS

| | | | | |
|---|---|---|---|---|
| 2021/0013285 | A1 | 1/2021 | Hsieh | |
| 2021/0026404 | A1 | 1/2021 | Hong et al. | |
| 2022/0116518 | A1 * | 4/2022 | Chen .................. | H04M 1/0264 |
| 2022/0328577 | A1 | 10/2022 | Cui et al. | |

FOREIGN PATENT DOCUMENTS

| | | | |
|---|---|---|---|
| CN | 110233167 | A | 9/2019 |
| CN | 110289301 | A | 9/2019 |
| CN | 110379837 | A | 10/2019 |
| CN | 110491920 | A | 11/2019 |
| CN | 110520919 | A | 11/2019 |
| CN | 110922916 | * | 3/2020 |
| CN | 110922916 | A | 3/2020 |
| CN | 111145646 | A | 5/2020 |
| CN | 111179744 | A | 5/2020 |
| CN | 111180490 | A | 5/2020 |
| CN | 111430422 | A | 7/2020 |
| CN | 111650768 | A | 9/2020 |
| CN | 111667774 | A | 9/2020 |
| CN | 112002710 | A | 11/2020 |
| JP | 2002334661 | A | 11/2002 |
| KR | 111697045 | A | 9/2020 |

OTHER PUBLICATIONS

The First Office Action mailed Apr. 19, 2025, in Chinese Application No. 202180001160.6, 27 pages including English translation.

* cited by examiner

DISPLAY MODULE, DISPLAY APPARATUS AND METHOD FOR MANUFACTURING THE SAME

CROSS-REFERENCE TO RELATED APPLICATION

The present application is a national phase entry under 35 USC 371 of International Patent Application No. PCT/CN2021/094054, filed on May 17, 2021, which is incorporated herein by reference in its entirety.

TECHNICAL FIELD

The present disclosure relates to the field of display technologies, and in particular, to a display module, a display apparatus and a method for manufacturing the same.

BACKGROUND

With the rapid development of display technologies, display apparatuses have spread throughout people's life. Electroluminescent display apparatuses have been widely used in smart products such as mobile phones, televisions and notebook computers and so on due to their advantages of self-luminescence, low power consumption, wide viewing angle, fast response speed, high contrast and the like.

SUMMARY

In an aspect, a display module is provided. The display module has a functional device arrangement region and a main display region surrounding the functional device arrangement region; wherein the functional device arrangement region is provided with a mounting hole therein, and the functional device arrangement region includes a reserved region surrounding the mounting hole; a side wall of the mounting hole is of one of a step-shaped structure and a protrusion-depression structure. The display module includes a display panel, a first light-shielding pattern, an adhesive layer and a second light-shielding pattern; the first light-shielding pattern is disposed on a light-exit side of the display panel, and an orthogonal projection of the first light-shielding pattern on the display panel substantially coincides with the reserved region of the display panel; the adhesive layer is disposed on a side of the first light-shielding pattern away from the display panel, and the mounting hole penetrates the display panel, the first light-shielding pattern and the adhesive layer; the second light-shielding pattern covers at least the side wall of the mounting hole.

In some embodiments, the display module further includes a circular polarizer. The circular polarizer is disposed between the display panel and the adhesive layer, and the first light-shielding pattern is located on a side of the circular polarizer proximate to the display panel, the mounting hole further penetrating the circular polarizer.

In some embodiments, the mounting hole includes a plurality of sub-holes, the plurality of sub-holes are arranged in a thickness direction of the display panel, and side walls of at least two adjacent sub-holes are not flush with each other.

In some embodiments, the mounting hole includes a first sub-hole, a second sub-hole and a third sub-hole. In a direction from the display panel to the adhesive layer, the first sub-hole, the second sub-hole and the third sub-hole are arranged in sequence.

A diameter of an end of the first sub-hole proximate to the second sub-hole is smaller than a diameter of an end of the second sub-hole proximate to the first sub-hole, and a side wall of the first sub-hole and a side wall of the second sub-hole provide a stepped structure; a diameter of an end of the second sub-hole proximate to the third sub-hole is smaller than a diameter of an end of the third sub-hole proximate to the second sub-hole, and the side wall of the second sub-hole and a side wall of the third sub-hole provide another stepped structure, the stepped structure and the another stepped structure constitute at least part of the step-shaped structure; alternatively, the diameter of the end of the second sub-hole proximate to the third sub-hole is equal to the diameter of the end of the third sub-hole proximate to the second sub-hole, and the side wall of the second sub-hole is flush with the side wall of the third sub-hole, the stepped structure and the side walls of the second sub-hole and the third sub-hole constitute at least part of the step-shaped structure; alternatively, the diameter of the end of the second sub-hole proximate to the third sub-hole is larger than the diameter of the end of the third sub-hole proximate to the second sub-hole, and the side wall of the third sub-hole protrudes relative to the side wall of the second sub-hole, the stepped structure and the side walls of the second sub-hole and the third sub-hole constitute at least part of the protrusion-depression structure.

In some embodiments, the second light-shielding pattern includes a first sub-pattern covering the side wall of the first sub-hole, a second sub-pattern covering the side wall of the second sub-hole, and a third sub-pattern covering the side wall of the third sub-hole; a border of the first sub-pattern proximate to the side wall of the first sub-hole is further close to an axis of the mounting hole relative to a border of the second sub-pattern proximate to the side wall of the second sub-hole; in a case where the diameter of the end of the second sub-hole proximate to the third sub-hole is smaller than the diameter of the end of the third sub-hole proximate to the second sub-hole, the border of the second sub-pattern proximate to the side wall of the second sub-hole is further close to the axis of the mounting hole relative to a border of the third sub-pattern proximate to the side wall of the third sub-hole; alternatively, in a case where the diameter of the end of the second sub-hole proximate to the third sub-hole is equal to the diameter of the end of the third sub-hole proximate to the second sub-hole, the border of the second sub-pattern proximate to the side wall of the second sub-hole is flush with the border of the third sub-pattern proximate to the side wall of the third sub-hole; alternatively, in a case where the diameter of the end of the second sub-hole proximate to the third sub-hole is larger than the diameter of the end of the third sub-hole proximate to the second sub-hole, the border of the second sub-pattern proximate to the side wall of the second sub-hole is further away from the axis of the mounting hole relative to the border of the third sub-pattern proximate to the side wall of the third sub-hole.

In some embodiments, the display module further includes a circular polarizer disposed between the display panel and the adhesive layer, the first light-shielding pattern being located on a side of the circular polarizer proximate to the display panel; the first sub-hole penetrates the display panel and the first light-shielding pattern, the second sub-hole penetrates the circular polarizer, and the third sub-hole penetrates the adhesive layer.

In some embodiments, the display module further includes a first protective layer, and the first protective layer is disposed on a side of the adhesive layer away from the display panel; the mounting hole further includes a fourth sub-hole penetrating the first protective layer; a diameter of an end of the fourth sub-hole proximate to the third sub-hole is larger than a diameter of an end of the third sub-hole proximate to the fourth sub-hole, and a side wall of the fourth sub-hole and the side wall of the third sub-hole provide another stepped structure.

In some embodiments, the second light-shielding pattern further includes a fourth sub-pattern, and the fourth sub-pattern covers at least a portion of a surface of the adhesive layer away from the display panel that exceeds the first protective layer. In some embodiments, the fourth sub-pattern and a portion, except the fourth sub-pattern, of the second light-shielding pattern that covers the side wall of the mounting hole are disposed as an integral structure.

In some embodiments, an orthogonal projection of the fourth sub-pattern on the display panel is located within the reserved region of the display panel, or substantially coincides with the reserved region of the display panel.

In some embodiments, the display module further includes a second protective layer, and the second protective layer is disposed on a side of the display panel away from the adhesive layer; the mounting hole further includes a fifth sub-hole penetrating the second protective layer; a diameter of an end of the fifth sub-hole proximate to the first sub-hole is equal to a diameter of an end of the first sub-hole proximate to the fifth sub-hole, and a side wall of the fifth sub-hole is flush with the side wall of the first sub-hole.

In some embodiments, the second light-shielding pattern further includes a fifth sub-pattern covering the side wall of the fifth sub-hole.

In some embodiments, a surface of the second light-shielding pattern proximate to an axis of the mounting hole is flat.

In some embodiments, the surface of the second light-shielding pattern proximate to the axis of the mounting hole is substantially parallel to the axis of the mounting hole.

In some embodiments, the first light-shielding pattern is connected to the second light-shielding pattern.

In some embodiments, a material of the first light-shielding pattern and the second light-shielding pattern is black ink or a black hot melt adhesive.

In another aspect, a method for manufacturing a display apparatus is provided. The method for manufacturing the display apparatus includes:

providing a display panel, the display panel including a functional device arrangement region and a main display region surrounding the functional device arrangement region; forming a first light-shielding pattern on a light-exit side of the display panel, an orthogonal projection of the first light-shielding pattern on the display panel substantially coinciding with the functional device arrangement region of the display panel;

providing a circular polarizer, an adhesive layer and a first protective layer sequentially on the light-exit side of the display panel on which the first light-shielding pattern has been formed; punching a hole in the functional device arrangement region of the display panel to form an initial hole, the initial hole penetrating the display panel, the first light-shielding pattern, the circular polarizer, the adhesive layer and the first protective layer; etching a side wall of the initial hole so that the side wall of the initial hole is of one of a step-shaped and a protrusion-depression structure, so as to form a mounting hole; and forming a second light-shielding pattern, the second light-shielding pattern covering at least a side wall of the mounting hole.

In some embodiments, etching the side wall of the initial hole so that the side wall of the initial hole is of the one of the step-shaped and the protrusion-depression structure, so as to form the mounting hole includes: etching the display panel, the circular polarizer, the adhesive layer and the first protective layer for multiple times by using a laser beam, so that the side wall of the initial hole is of the one of the step-shaped and the protrusion-depression structure; or converging at least two focal points of at least two laser beams on at least two of the display panel, the circular polarizer, the adhesive layer and the first protective layer respectively, and etching the display panel, the circular polarizer, the adhesive layer and the first protective layer synchronously by using the at least two laser beams, so that the side wall of the initial hole is of the one of the step-shaped and the protrusion-depression structure.

In some embodiments, before punching the hole in the functional device arrangement region of the display panel, the manufacturing method further comprises: forming a second protective layer on a side of the display panel away from the adhesive layer; the initial hole formed by punching the hole in the functional device arrangement region of the display panel further penetrating the second protective layer.

In some embodiments, before forming the second light-shielding pattern, the manufacturing method further includes: forming a process film on a side of the second protective layer away from the display panel; and after forming the second light-shielding pattern on the side wall of the mounting hole, the manufacturing method further includes: removing the process film.

In some embodiments, after forming the second light-shielding pattern, the manufacturing method further includes: removing the first protective layer, and providing a cover plate on a side of the adhesive layer away from the display panel.

In yet another aspect, a display apparatus is provided. The display apparatus includes a display module and a cover plate. The display module has a functional device arrangement region and a main display region surrounding the functional device arrangement region; wherein the functional device arrangement region is provided with a mounting hole therein, and the functional device arrangement region includes a reserved region surrounding the mounting hole; a side wall of the mounting hole is of one of a step-shaped and a protrusion-depression structure. The display module includes a display panel, a first light-shielding pattern, an adhesive layer and a second light-shielding pattern; the first light-shielding pattern is disposed on a light-exit side of the display panel, and an orthogonal projection of the first light-shielding pattern on the display panel substantially coincides with the reserved region of the display panel; the adhesive layer is disposed on a side of the first light-shielding pattern away from the display panel, and the mounting hole penetrates the display panel, the first light-shielding pattern and the adhesive layer; the second light-shielding pattern covers at least the side wall of the mounting hole. The cover plate is disposed on a side of the adhesive layer away from the display panel.

In some embodiments, the second light-shielding pattern includes a fourth sub-pattern, and the fourth sub-pattern covers at least a portion of a surface of the adhesive layer away from the display panel that exceeds the first protective layer; a surface of the cover plate proximate to the display panel is in contact with a surface of the fourth sub-pattern.

In some embodiments, the display module further includes a circular polarizer. The circular polarizer is disposed between the display panel and the adhesive layer, and the first light-shielding pattern is located on a side of the circular polarizer proximate to the display panel, and the mounting hole further penetrates the circular polarizer.

In some embodiments, the display module further includes a second protective layer. The second protective layer is disposed on a side of the display panel away from the adhesive layer, and the mounting hole further penetrates the second protective layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Figure 1:
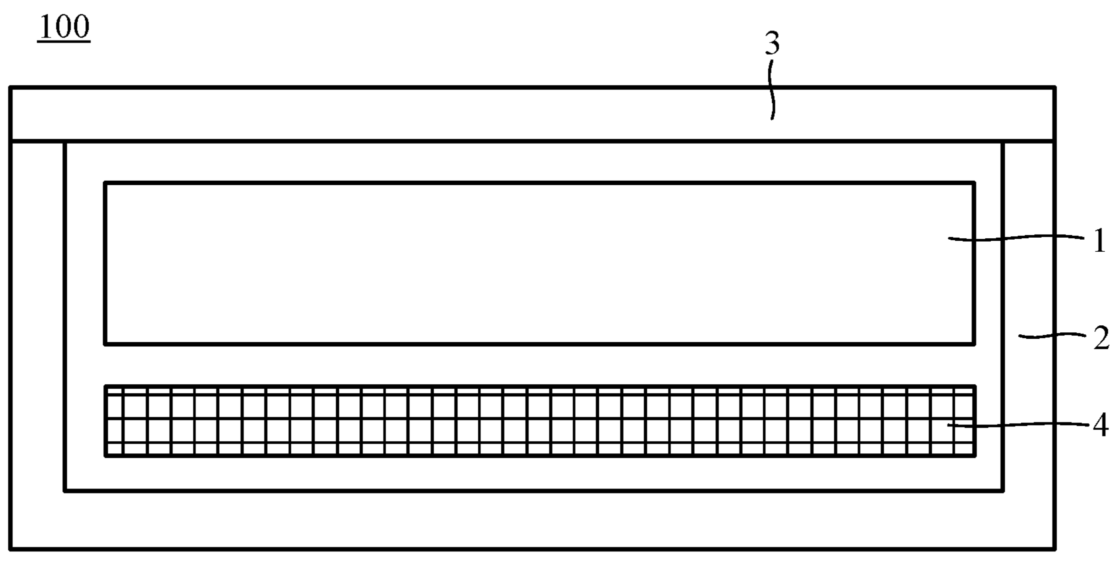
FIG. 1 is a schematic diagram showing a basic structure of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or example(s). In addition, the specific features, structures, materials or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more features. In the description of the embodiments of the present disclosure, the term "a plurality of" means two or more unless otherwise specified.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

As shown in FIG. 1, some embodiments of the present disclosure provide a display apparatus 100. The display apparatus 100 may be a television (TV), a mobile phone, a computer, a notebook computer, a tablet computer, a personal digital assistant (PDA), an in-vehicle computer, or the like.

As shown in FIG. 1, the display apparatus 100 includes a display panel 1, a frame 2, a cover plate 3, a circuit board 4 and other electronic accessories.

A longitudinal section of the frame 2 is U-shaped. The cover plate 3 is disposed on an opening side of the frame 2. The display panel 1, the circuit board 4 and other electronic accessories are all arranged in the frame 2. The circuit board 4 is disposed on a side of the display panel 1 away from the cover plate 3.

Figure 2:
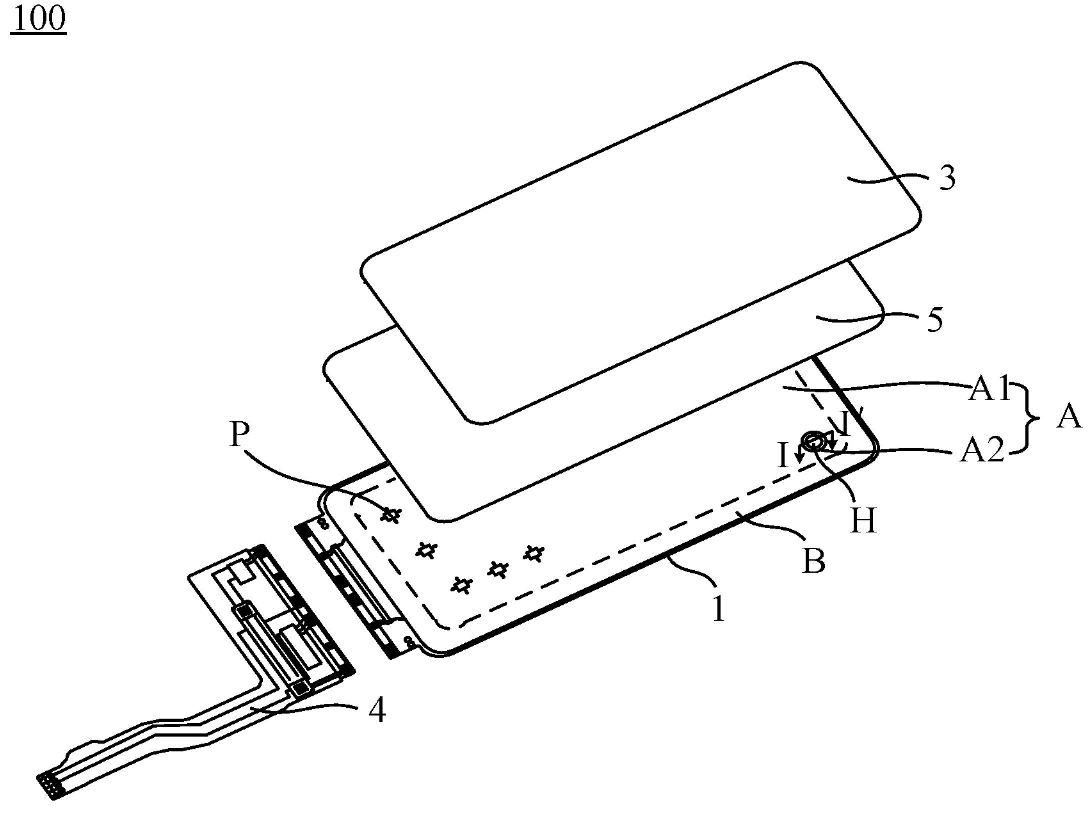
FIG. 2 is an exploded view of a display apparatus, in accordance with some embodiments.
Figure 3:
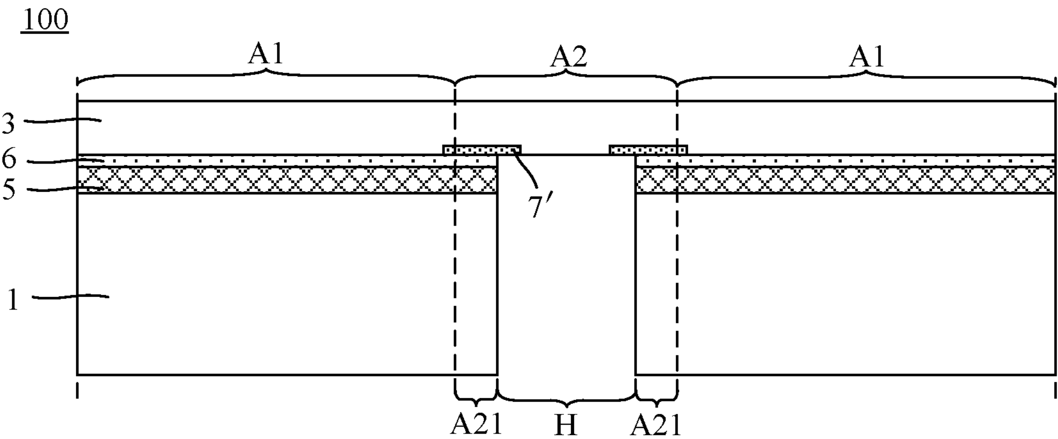
FIG. 3 is a partial section view of a display apparatus, in accordance with the related art.

In some embodiments, as shown in FIG. 2, the display apparatus 100 further includes a circular polarizer 5 disposed between the cover plate 3 and the display panel 1. The circular polarizer 5 is configured to reduce reflected light of external light after being reflected by a metal structure in the display panel 1. Referring to FIG. 3, the circular polarizer 5 may be adhered to the cover plate 3 through an adhesive layer 6; for example, the circular polarizer 5 is adhered to the cover plate 3 through an optical adhesive.

In some embodiments, as shown in FIG. 2, the display panel 1 has a display area A and a peripheral area B located on at least one side of the display area A. FIG. 2 illustrates a case where the peripheral area B surrounds the display area A.

The display area A is an area where an image is displayed. The peripheral area B is an area where no image is displayed, and is configured to provide display drive circuits, e.g., a gate drive circuit and a source drive circuit.

In some embodiments, as shown in FIGS. 2 and 3, the display area A includes a functional device arrangement region A2 and a main display region A1 surrounding the functional device arrangement region. The main display region A1 is configured to arrange a plurality of sub-pixels P. The functional device arrangement region A2 is provided with a mounting hole H, and the functional device arrangement region A2 includes a reserved region A21 surrounding the mounting hole H.

At least one functional device may be disposed in the mounting hole H. The functional device may be a camera, an infrared sensor, a proximity sensor, an eye tracking module, a face recognition module, or the like. For example, as shown in FIG. 2, the functional device arrangement region A2 is a camera arrangement region, and a functional device is a camera.

Figure 4A:
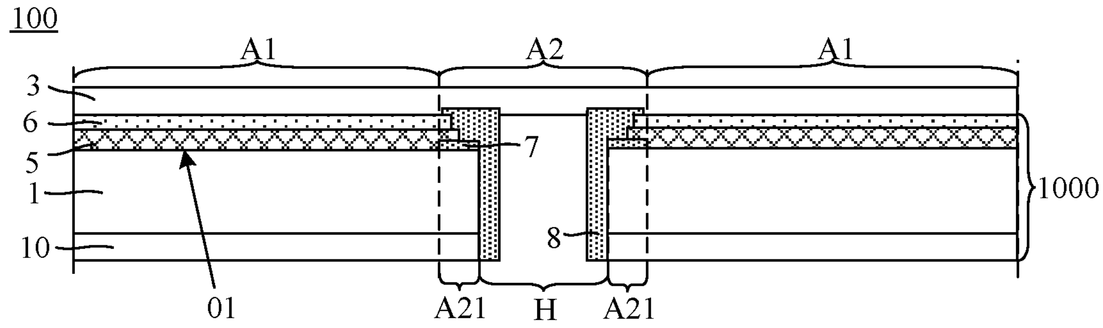
FIG. 4A is a partial section view of the display apparatus shown in FIG. 2 taken along the II' line.
Figure 4B:
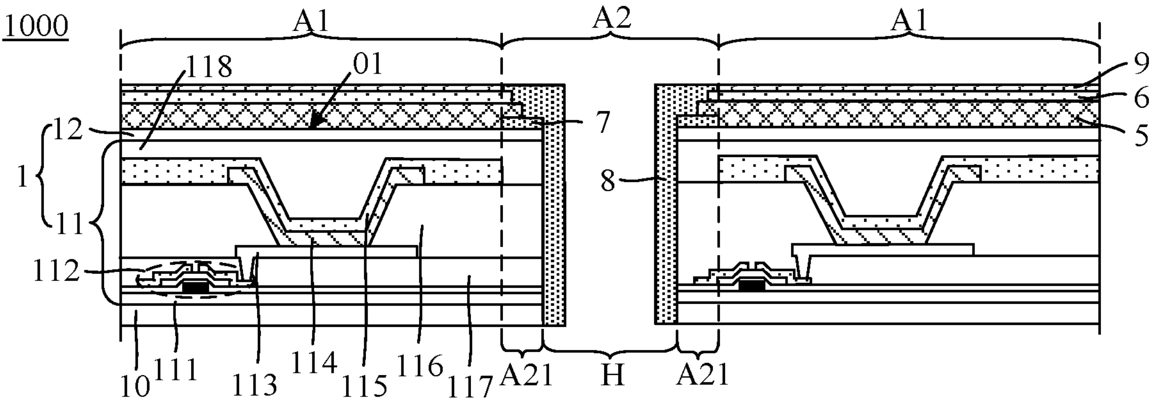
FIG. 4B is a partial section view of the display module shown in FIG. 2 taken along the II' line.

As shown in FIG. 4B, the display panel 1 includes a display substrate 11 and an encapsulation layer 12 for encapsulating the display substrate 11.

Here, the encapsulation layer 12 may be an encapsulation film or an encapsulation substrate.

In some embodiments, as shown in FIG. 4B, each sub-pixel P (referring to FIG. 2) in the display substrate 11 includes a light-emitting device and a pixel driving circuit that are disposed on a substrate 111. The pixel driving circuit includes a plurality of thin film transistors 112. A thin film transistor 112 includes an active layer, a source, a drain, a gate and a gate insulating layer. The source and the drain are in contact with the active layer. In a direction parallel to a thickness direction of the substrate 111 and moving away from the substrate 111, the light-emitting device includes a first electrode 113, a light-emitting functional layer 114, and a second electrode 115.

Here, the first electrode 113 is an anode of the light-emitting device, and the second electrode 115 is a cathode of the light-emitting device; alternatively, the first electrode 113 is a cathode of the light-emitting device, and the second electrode 115 is an anode of the light-emitting device. The above situations are both allowable, and may be selected according to actual situations.

For example, as shown in 4B, the first electrode 113 is the anode of the light-emitting device, and the second electrode is the cathode of the light-emitting device. The first electrode 113 is electrically connected to a source or a drain of a thin film transistor 112 as a driving transistor in the thin film transistors 112.

The display substrate 11 further includes a pixel defining layer 116. The pixel defining layer 116 has a plurality of opening regions, and a light-emitting device 312 is disposed in an opening region.

In some embodiments, the light-emitting functional layer 114 includes only a light-emitting layer. In some other embodiments, in addition to the light-emitting layer, the light-emitting functional layer 114 further includes at least one of an electron transporting layer (ETL), an electron injection layer (EIL), a hole transporting layer (HTL), or a hole injection layer (HIL).

As shown in FIG. 4B, the display substrate 11 further includes a first planarization layer 117 disposed between the thin film transistor 112 and the first electrode 113.

As shown in FIG. 4B, the display substrate 11 further includes a second planarization layer 118 disposed between the encapsulation layer 12 and the second electrode 115.

In the related art, as shown in FIG. 3, a surface of the cover plate 3 proximate to the display panel 1 is provided with a light-shielding pattern 7' thereon. An orthogonal projection of an inner boundary of the light-shielding pattern 7' on the display panel 1 is located inside an inner boundary of the reserved region A21, so as to prevent light leakage at the mounting hole H; an orthogonal projection of an outer boundary of the light-shielding pattern 7' on the display panel 1 is located outside an outer boundary of the reserved area A21 or approximately coincides with the outer boundary of the reserved region A21, so as to shield poor cutting such as burrs on a side wall of the mounting hole H and cracks at an edge of the mounting hole H.

However, in a manufacturing process of the display apparatus 100 in the related art, the cover plate 3 and the circular polarizer 5 need to be aligned once, and requirements for the process precision of the light-shielding pattern 7' provided on the cover plate 3 are relatively high. In this case, in order to ensure that the light-shielding pattern 7' can shield the poor cutting such as the burrs on the side wall of the mounting hole H and the cracks in the reserved region A21 surrounding the mounting hole H, and in order to prevent the light leakage at the mounting hole H, it is impossible to design a width of the light-shielding pattern 7' to be very small (a limit of the width of the light-shielding pattern 7' may be up to 0.5 mm). As a result, the display area is reduced, and a screen-to-body ratio is reduced.

Some embodiments of the present disclosure provide a display module 1000. Referring to FIGS. 4B, 5B, 6B and 7, the display module 1000 has the functional device arrangement region A2 and the main display region A1 surrounding the functional device arrangement region A2; the mounting hole H is disposed in the functional device arrangement region A2, and the functional device arrangement region A2 includes the reserved region A21 surrounding the mounting hole H; the side wall of the mounting hole H is of a step-shaped structure or a protrusion-depression structure.

As shown in FIG. 4B, the display module 1000 includes the display panel 1, a first light-shielding pattern 7, an adhesive layer 6 and a second light-shielding pattern 8. The first light-shielding pattern 7 is disposed on a light-exit side 01 of the display panel 1. An orthogonal projection of the first light-shielding pattern 7 on the display panel 1 substantially coincides with the reserved region A21 of the display panel 1, so as to shield the poor cutting such as the cracks in the reserved region A21 surrounding the mounting hole H. The adhesive layer 6 is disposed on a side of the first light-shielding pattern 7 away from the display panel 1, and the mounting hole H penetrates the display panel 1, the first light-shielding pattern 7 and the adhesive layer 6. The second light-shielding pattern 8 covers at least the side wall of the mounting hole H to shield the burrs on the side wall of the mounting hole H and effectively prevent the light leakage at the mounting hole H.

As can be seen from the above, in the display module 1000 provided by some embodiments of the present disclosure, the first light-shielding pattern 7 is disposed on the light-exit side of the display panel 1, and the adhesive layer 6 is disposed on the side of the first light-shielding pattern 7 away from the display panel 1. In this way, the first light-shielding pattern 7 may be directly formed in the reserved region A21 of the display panel 1 by using a deposition process (e.g., evaporation) or a photolithography process, which may reduce process difficulty compared with providing the first light-shielding pattern 7 on the cover plate 3. Based on this, compared with the related art, a width of the first light-shielding pattern 7 in the display module 1000 provided by some embodiments of the present disclosure may be designed to be smaller (the width of the first light-shielding pattern 7 being approximately 0.3 mm), thereby increasing the display area.

In addition, the side wall of the mounting hole H is of the step-shaped structure or the protrusion-depression structure, so that a contact area between the second light-shielding pattern 8 and the mounting hole H may be increased, adhesion between the second light-shielding pattern 8 and the mounting hole H may be strengthened, and a risk of detachment of the second light-shielding pattern 8 may be reduced.

A material of the first light-shielding pattern 7 and the second light-shielding pattern 8 is black ink or a black hot melt adhesive. Of course, the first light-shielding pattern 7 and the second light-shielding pattern 8 may be made of other black light-shielding materials, and the embodiments of the present disclosure are not limited thereto.

In some embodiments, as shown in FIGS. 4B, 5B, 6B and 7, the first light-shielding pattern 7 is connected to the second light-shielding pattern 8 to ensure that there is no light leakage area between the first light-shielding pattern 7 in the reserved region A21 and the second light-shielding pattern 8 on the side wall of the mounting hole H, so that the light leakage at the mounting hole H is effectively prevented.

In order to prevent external ambient light from interfering with an image to be displayed, in some embodiments, as shown in FIGS. 4B, 4C, 5B, 5C, 6B to 7, the display module 1000 further includes a circular polarizer 5. The circular polarizer 5 is disposed between the display panel 1 and the adhesive layer 6, and the first light-shielding pattern 7 is located on a side of the circular polarizer 5 proximate to the display panel 1; the mounting hole H further penetrates the circular polarizer 5. In this case, the circular polarizer 5 may effectively prevent the external ambient light from interfering with the image to be displayed.

Figure 7:
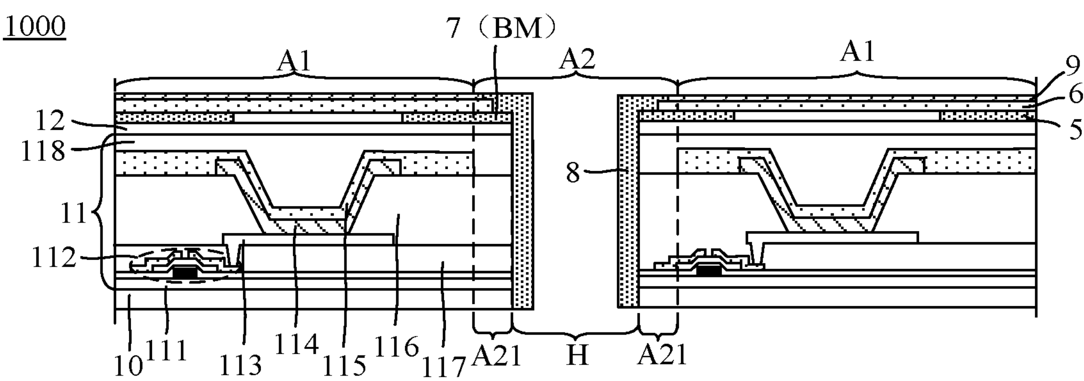
FIG. 7 is yet another partial section view of the display module shown in FIG. 2 taken along the II' line.

In some other embodiments, referring to FIG. 7, the display module 1000 includes black matrix patterns BM, and the black matrix patterns BM are disposed between the display panel 1 and the adhesive layer 6. The black matrix pattern BM is configured to separate light emitted from different sub-pixels, and reduce effect of generating reflected light after the external ambient light enters the display panel 1, i.e., reduce interference of the external ambient light on the image to be displayed. In this case, the first light-shielding pattern 7 may be disposed in a same layer and made of a same material as the black matrix patterns BM.

Figure 4C:
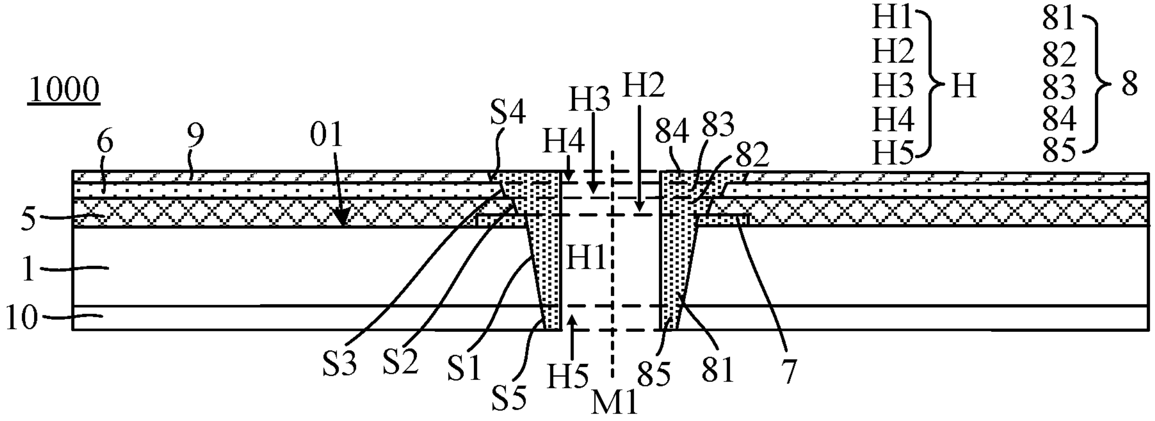
FIG. 4C is a partial section view of a basic structure of the display module shown in FIG. 2 taken along the II' line.
Figure 5A:
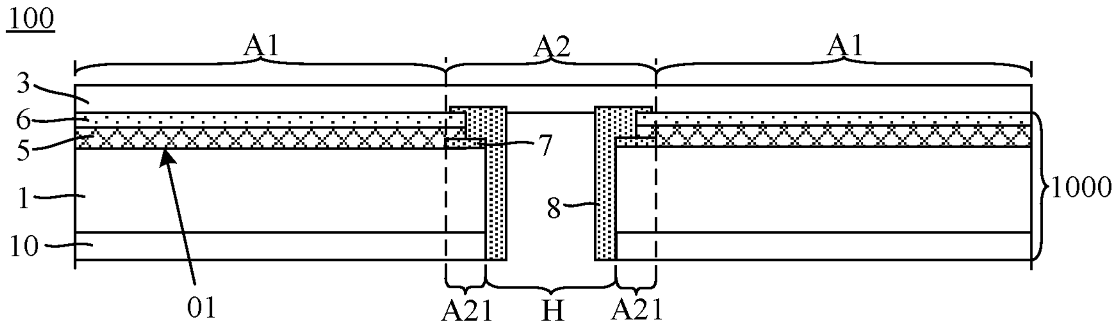
FIG. 5A is another partial section view of the display apparatus shown in FIG. 2 taken along the II' line.
Figure 5B:
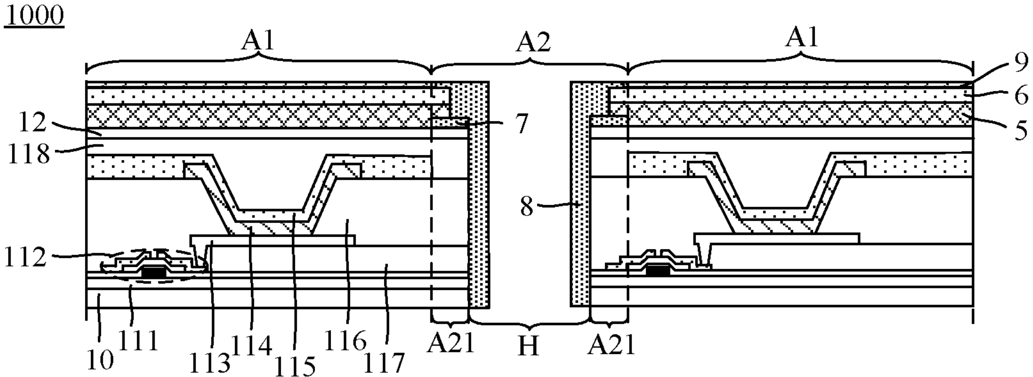
FIG. 5B is another partial section view of the display module shown in FIG. 2 taken along the II' line.
Figure 5C:
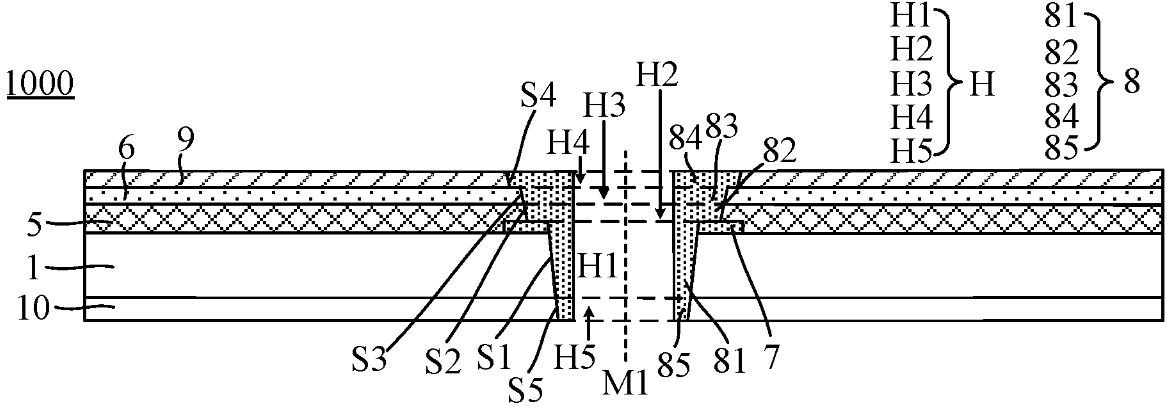
FIG. 5C is another partial section view of the basic structure of the display module shown in FIG. 2 taken along the II' line.
Figure 6A:
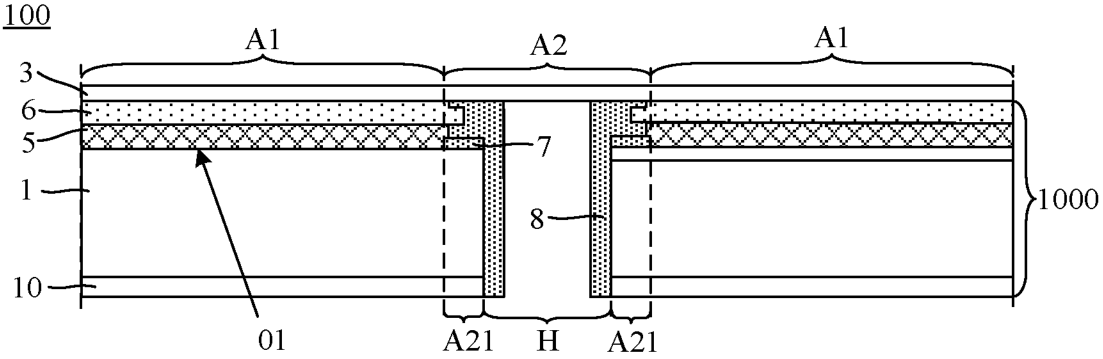
FIG. 6A is yet another partial section view of the display apparatus shown in FIG. 2 taken along the II' line.
Figure 6B:
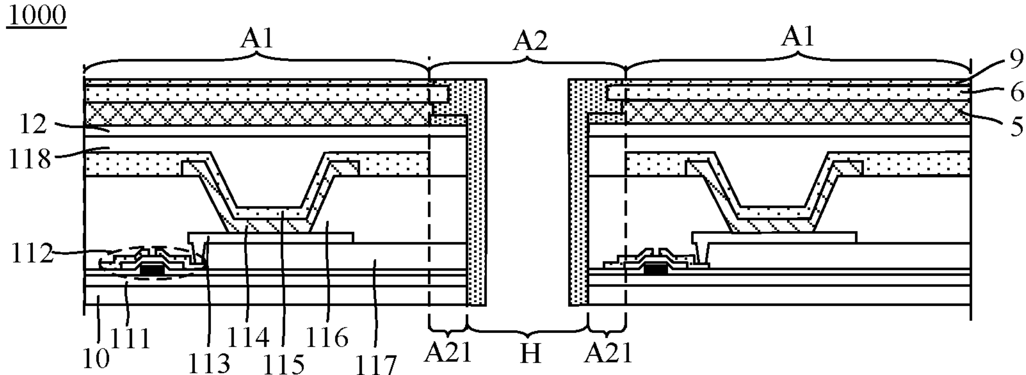
FIG. 6B is yet another partial section view of the display module shown in FIG. 2 taken along the II' line.
Figure 6C:
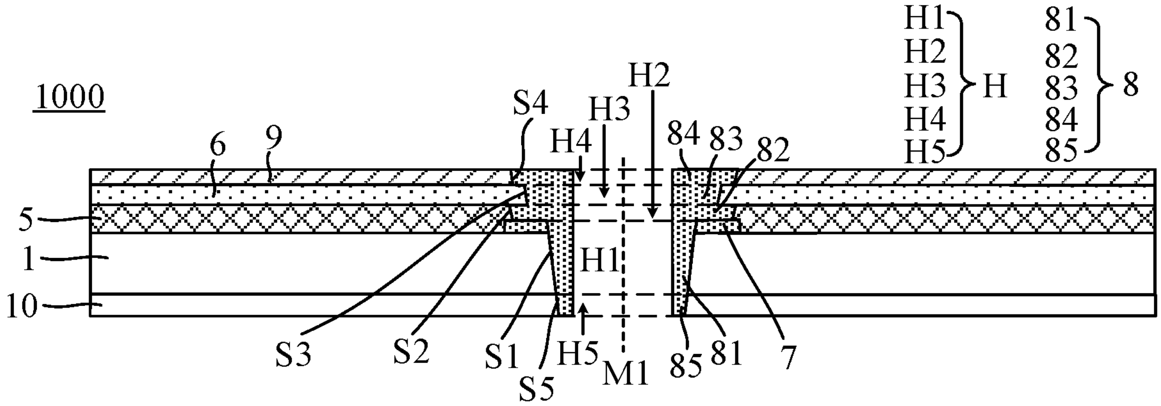
FIG. 6C is yet another partial section view of the basic structure of the display module shown in FIG. 2 taken along the II' line.

In some embodiments, as shown in FIGS. 4C, 5C and 6C, the mounting hole H includes a plurality of sub-holes. The plurality of sub-holes are arranged in a thickness direction of the display panel 1, and sides walls of at least two adjacent sub-holes are not flush with each other.

It will be noted that, a surface of a side wall of each sub-hole is flat, and the side wall of each sub-hole may be substantially parallel to the thickness direction of the display panel 1 (referring to FIGS. 4B, 5B and 6B), or the side wall of each sub-hole may be at a certain angle to the thickness direction of the display panel 1 (referring to FIGS. 4C, 5C and 6C). In a case where the side wall of each sub-hole is at a certain angle to the thickness direction of the display panel 1, a difference between a maximum diameter and a minimum diameter of each sub-hole is in a range of 30 μm to 100 μm inclusive.

For example, as shown in FIGS. 4C, 5C and 6C, the mounting hole H includes a first sub-hole H1, a second sub-hole H2 and a third sub-hole H3. In a direction from the display panel 1 to the adhesive layer 6, the first sub-hole H1, the second sub-hole H2 and the third sub-hole H3 are arranged in sequence.

Correspondingly, as shown in FIGS. 4C, 5C and 6C, the second light-shielding pattern 8 includes a first sub-pattern 81 covering a side wall of the first sub-hole H1, a second sub-pattern 82 covering a side wall of the second sub-hole H2, and a third sub-pattern 83 covering a side wall of the third sub-hole H3.

In some embodiments, as shown in FIG. 4C, a diameter of an end of the first sub-hole H1 proximate to the second sub-hole H2 is smaller than a diameter of an end of the second sub-hole H2 proximate to the first sub-hole H1, and the side wall S1 of the first sub-hole H1 and the side wall S2 of the second sub-hole H2 provide a stepped structure; a diameter of an end of the second sub-hole H2 proximate to the third sub-hole H3 is smaller than a diameter of an end of the third sub-hole H3 proximate to the second sub-hole H2, and the side wall S2 of the second sub-hole H2 and the side wall S3 of the third sub-hole H3 provide another stepped structure. For example, the diameter of the end of the first sub-hole H1 proximate to the second sub-hole H2 is 50 μm to 150 μm smaller than the diameter of the end of the second sub-hole H2 proximate to the first sub-hole H1, and the diameter of the end of the second sub-hole H2 proximate to the third sub-hole H3 is 50 μm to 150 μm smaller than the diameter of the end of the third sub-hole H3 proximate to the second sub-hole H2.

Correspondingly, as shown in FIG. 4C, a border of the first sub-pattern 81 proximate to the side wall S1 of the first sub-hole H1 is further close to an axis M1 of the mounting hole H relative to a border of the second sub-pattern 82 proximate to the side wall S2 of the second sub-hole H2; the border of the second sub-pattern 82 proximate to the side wall S2 of the second sub-hole H2 is further close to the axis M1 of the mounting hole H relative to a border of the third sub-pattern 83 proximate to the side wall S3 of the third sub-hole H3.

In some other embodiments, as shown in FIG. 5C, the diameter of the end of the first sub-hole H1 proximate to the second sub-hole H2 is smaller than the diameter of the end of the second sub-hole H2 proximate to the first sub-hole H1, and the side wall S1 of the first sub-hole H1 and the side wall S2 of the second sub-hole H2 provide a stepped structure; the diameter of the end of the second sub-hole H2 proximate to the third sub-hole H3 is equal to the diameter of the end of the third sub-hole H3 proximate to the second sub-hole H2, and the side wall S2 of the second sub-hole H2 is flush with the side wall S3 of the third sub-hole H3. For example, the diameter of the end of the first sub-hole H1 proximate to the second sub-hole H2 is 50 μm to 150 μm smaller than the diameter of the end of the second sub-hole H2 proximate to the first sub-hole H1.

Correspondingly, as shown in FIG. 5C, the border of the first sub-pattern 81 proximate to the side wall S1 of the first sub-hole H1 is further close to the axis M1 of the mounting hole H relative to the border of the second sub-pattern 82 proximate to the side wall S2 of the second sub-hole H2; the border of the second sub-pattern 82 proximate to the side wall S2 of the second sub-hole H2 is flush with the border of the third sub-pattern 83 proximate to the side wall S3 of the third sub-hole H3.

In yet some other embodiments, as shown in FIG. 6C, the diameter of the end of the first sub-hole H1 proximate to the second sub-hole H2 is smaller than the diameter of the end of the second sub-hole H2 proximate to the first sub-hole H1, and the side wall S1 of the first sub-hole H1 and the side wall S2 of the second sub-hole H2 provide a stepped structure; the diameter of the end of the second sub-hole H2 proximate to the third sub-hole H3 is larger than the diameter of the end of the third sub-hole H3 proximate to the second sub-hole H2, and the side wall S3 of the sub-hole H3 protrudes relative to the side wall S2 of the second sub-hole H2. For example, the diameter of the end of the first sub-hole H1 proximate to the second sub-hole H2 is 50 μm to 200 μm smaller than the diameter of the end of the second sub-hole H2 proximate to the first sub-hole H1, and the diameter of the end of the second sub-hole H2 proximate to the third sub-hole H3 is 50 μm to 200 μm larger than the diameter of the end of the third sub-hole H3 proximate to the second sub-hole H2.

Correspondingly, as shown in FIG. 6C, the border of the first sub-pattern 81 proximate to the side wall S1 of the first sub-hole H1 is further close to the axis M1 of the mounting hole H relative to the border of the second sub-pattern 82 proximate to the side wall S2 of the second sub-hole H2; the border of the second sub-pattern 82 proximate to the side wall S2 of the second sub-hole H2 is further away from the axis M1 of the mounting hole H relative to the border of the third sub-pattern 83 proximate to the side wall S3 of the third sub-hole H3.

The display panel 1 is provided with a plurality of inorganic films therein. Compared with organic films, the inorganic films are more fragile. During a process of punching a hole in the display panel 1, cracks are prone to be generated at edge of the inorganic films corresponding to the hole. Based on this, in some embodiments, as shown in FIGS. 4C, 5C and 6C, the first sub-hole H1 penetrates the display panel 1 and the first light-shielding pattern 7, the second sub-hole H2 penetrates the circular polarizer 5, and the third sub-hole H3 penetrates the adhesive layer 6.

In this case, the display panel 1 need to be punched only once, and there is no need to cut the side walls of the sub-hole corresponding to the display panel 1, so that a risk of generating cracks at an edge of the sub-hole corresponding to the display panel 1 may be reduced, and a width of the reserved region A21 of the display panel 1 may be designed to be small.

It will be noted that, in the embodiments of the present disclosure, a film layers that the first sub-hole H1, the second sub-hole H2 and the third sub-hole H3 penetrate respectively are not limited thereto.

In some embodiments, as shown in FIGS. 4B, 4C, 5B, 5C, 6B, 6C, and 7, the display module 1000 further includes a first protective layer 9. The first protective layer 9 is disposed on a surface of the adhesive layer 6 away from the display panel 1, and the first protective layer 9 protects the surface of the adhesive layer 6 away from the display panel 1.

In order to manufacture the display apparatus 100, in a subsequent process, the first protective layer 9 of the display module 1000 needs to be peeled off to adhere the cover plate 3 to the adhesive layer. Based on this, the first protective layer 9 may be a release film, which facilitates peeling off of the first protective layer 9.

Based on this, as shown in FIGS. 4C, 5C and 6C, the mounting hole H further includes a fourth sub-hole H4 penetrating the first protective layer 9. A diameter of an end of the fourth sub-hole H4 proximate to the third sub-hole H3 is larger than a diameter of an end of the third sub-hole H3 proximate to the fourth sub-hole H4, and a side wall S4 of the fourth sub-hole H4 and the side wall S3 of the third sub-hole H3 provide another stepped structure. For example, the diameter of the end of the fourth sub-hole H4 proximate to the third sub-hole H3 is 100 μm to 300 μm larger than the diameter of the end of the third sub-hole H3 proximate to the fourth sub-hole H4.

Correspondingly, as shown in FIGS. 4C, 5C and 6C, the second light-shielding pattern 8 further includes a fourth sub-pattern 84, and the fourth sub-pattern 84 covers at least a portion of the surface of the adhesive layer 6 away from the display panel 1 that exceeds the first protective layer 9. For example, an orthogonal projection of the fourth sub-pattern 84 on the display panel 1 is located within the reserved region A21 of the display panel 1; for another example, the orthogonal projection of the fourth sub-pattern 84 on the display panel 1 substantially coincides with the reserved region A21 of the display panel.

In this case, since the fourth sub-pattern 84 is further adhered to the adhesive layer 6 over a large area, during a process of peeling off the first protective layer 9, it is possible to reduce a risk of picking at a contact position between the first protective layer 9 and the fourth sub-pattern 84, and facilitate the peeling off.

In addition, the fourth sub-pattern 84 may further shield cracks at edges in the reserved region A21 of sub-holes on a side of the first light-shielding pattern 7 away from the display panel 1, and further reduce the risk of light leakage.

In a process of forming the fourth sub-pattern 84, the fourth sub-pattern 84 is integrally formed with a portion, except the fourth sub-pattern, of the second light-shielding pattern 8 that covers the side wall of the mounting hole H, so that processes may be simplified, and manufacturing costs may be reduced.

In some embodiments, as shown in FIGS. 4A, 4B, 4C, 5B, 5C, 6B, 6C and 7, the display module 1000 further includes a second protective layer 10. The second protective layer 10 is disposed on a side of the display panel 1 away from the adhesive layer 6, so as to support and protect the display panel 1.

Based on this, as shown in FIGS. 4C, 5C and 6C, the mounting hole H further includes a fifth sub-hole H5 penetrating the second protective layer 10. A diameter of an end of the fifth sub-hole H5 proximate to the first sub-hole H1 is equal to a diameter of an end of the first sub-hole H1 proximate to the fifth sub-hole H5, and a side wall S5 of the fifth sub-hole H5 is flush with the side wall S1 of the first sub-hole H1.

Correspondingly, as shown in FIGS. 4C, 5C and 6C, the second light-shielding pattern further includes a fifth sub-pattern 85 covering the side wall of the fifth sub-hole.

In some embodiments, as shown in FIGS. 4C, 5C and 6C, a surface of the second light-shielding pattern 8 proximate to the axis M1 of the mounting hole H is flat, so as to reduce undesirable interference to external light received by an opening at an end of the second light-shielding pattern 8 that corresponds to a display side of the display panel 1, and to ensure that more external light may enter the functional device through the mounting hole H.

In addition, as shown in FIGS. 4C, 5C, and 6C, the surface of the second light-shielding pattern 8 proximate to the axis M1 of the mounting hole H is substantially parallel to the axis M1 of the mounting hole H. That is to say, an inner diameter of the second light-shielding pattern 8 is approximately equal, and most of the external light received by the opening at the end of the second light-shielding pattern 8 that corresponds to the display side of the display panel 1 may enter the functional device through the mounting hole H. In this way, it is possible to ensure that sufficient external light may enter the functional device through the mounting hole H in a case where the functional device arrangement region A2 occupies a small part of the display area.

Figure 8:
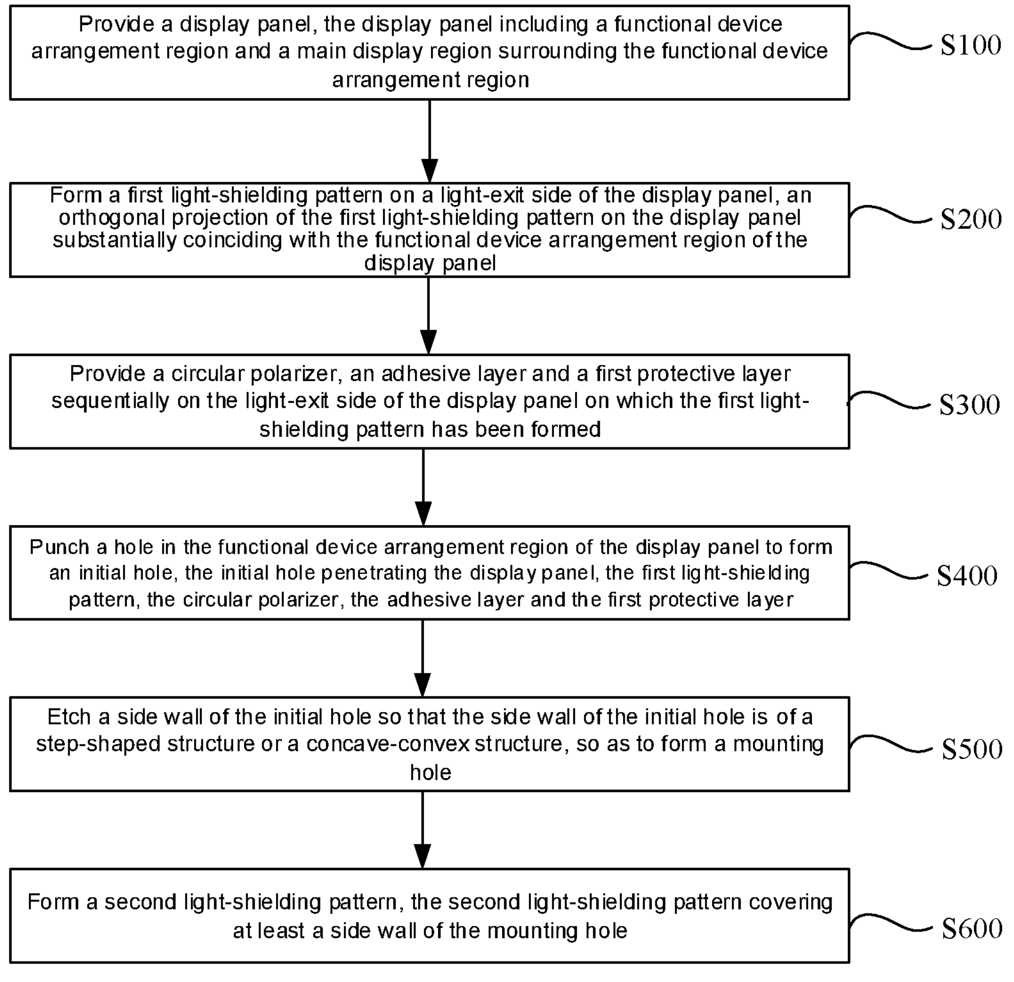
FIG. 8 is a flow diagram of a method for manufacturing a display apparatus, in accordance with some embodiments.

Some embodiments of the present disclosure provide a method for manufacturing a display apparatus 100. As shown in FIG. 8, the manufacturing method includes S100 to S600.

In S100, a display panel 1 is provided. The display panel 1 has a functional device arrangement region A2 and a main display region A1 surrounding the functional device arrangement region A2.

In S200, a first light-shielding pattern 7 is formed on a light-exit side of the display panel 1, and an orthogonal projection of the first light-shielding pattern 7 on the display panel 1 substantially coincides with the functional device arrangement region A2 of the display panel 1.

For example, a first light-shielding film is formed on the light-exit side of the display panel 1 by using a coating method, and then the first light-shielding pattern 7 is obtained through exposure, development and etching in sequence. The orthogonal projection of the first light-shielding pattern 7 on the display panel 1 substantially coincides with the functional device arrangement region A2 of the display panel 1.

In S300, a circular polarizer 5, an adhesive layer 6 and a first protective layer 9 are sequentially provided on the light-exit side of the display panel 1 on which the first light-shielding pattern 7 has been formed.

For example, the circular polarizer 5 may be disposed on a side of the first light-shielding pattern 7 away from the display panel 1 through an adhesion method, and is adhered to the display panel 1 and the first light-shielding pattern 7; the adhesive layer 6 and the first protective layer 9 are of an integral structure, and are directly adhered to a surface of the circular polarizer 5 away from the display panel 1.

In S400, a hole is punched in the functional device arrangement region A2 of the display panel 1 to form an initial hole, and the initial hole penetrates the display panel 1, the first light-shielding pattern 7, the circular polarizer 5, the adhesive layer 6 and the first protective layer 9.

For example, on a side of the first protective layer 9 away from the display panel 1, a focal point of a laser beam is converged on a side of the display panel 1 away from the adhesive layer 6, so as to cut the first protective layer 9, the adhesive layer 6, the circular polarizer 5, the first light-shielding pattern 7 and the display panel 1 to form the initial hole.

For example, a pulsed femtosecond laser is used to emit a laser beam with a frequency of 500 KHZ to 800 KHZ to perform cutting at a corresponding cutting speed of 300 mm/s to 1500 mm/s for 30 to 100 times to form the initial hole.

In S500, a side wall of the initial hole is etched, so that the side wall of the initial hole is of a step-shaped structure or a protrusion-depression structure, so as to form a mounting hole H.

For example, the display panel 1, the circular polarizer 5, the adhesive layer 6 and the first protective layer 9 are etched for multiple times by using a laser beam, so that the side wall of the initial hole is of the step-shaped structure or the protrusion-depression structure.

For example, first, a focal point of a laser beam is converged on the circular polarizer 5 for etching, so that a side wall corresponding to a portion of the mounting hole H penetrating the circular polarizer 5 is retracted by 50 μm to 150 μm in a direction moving away from an axis of the mounting hole H, compared with a side wall corresponding to a portion of the mounting hole H penetrating the display panel 1; then, the focal point of the laser beam is converged on the adhesive layer 6 for etching, so that a side wall corresponding to a portion of the mounting hole H penetrating the adhesive layer 6 is substantially flush with the side wall corresponding to the portion of the mounting hole H penetrating the circular polarizer 5; and then, the focal point of the laser beam is converged on the first protective layer 9 for etching, so that a side wall corresponding to a portion of the mounting hole H penetrating the first protective layer 9 is retracted by 100 μm to 300 μm in the direction moving away from the axis of the mounting hole H, compared with the side wall corresponding to the portion corresponding to the mounting hole H penetrating the circular polarizer 5. In this way, the side wall of the initial hole is of the step-shaped structure, and the mounting hole H is formed (referring to FIG. 5C).

For another example, first, a focal point of a laser beam is converged on the circular polarizer 5 for etching, so that the side wall corresponding to the portion of the mounting hole H penetrating the circular polarizer 5 is retracted by 50 μm to 200 μm in the direction moving away from the axis of the mounting hole H; then, the focal point of the laser beam is converged on the first protective layer 9 for etching, so that the side wall corresponding to the portion of the mounting hole H penetrating the first protective layer 9 is retracted by 50 μm to 200 μm in the direction moving away from the axis of the mounting hole H. In this way, the side wall of the initial hole is of the protrusion-depression structure, and the mounting hole H is formed (referring to FIG. 6C).

For example, at least two focal points of at least two laser beams are converged on at least two of the display panel, the circular polarizer, the adhesive layer and the first protective layer respectively, and the display panel, the circular polarizer, the adhesive layer and the first protective layer are synchronously etched by using the at least two laser beams, so that the side wall of the initial hole is of the step-shaped structure or the protrusion-depression structure.

For example, three focal points of three laser beams are converged on the circular polarizer 5, the adhesive layer 6 and the first protective layer 9 respectively for etching, so that the side walls corresponding to the portions of the mounting hole H penetrating the circular polarizer 5 and the adhesive layer 6 are retracted by 50 μm to 150 μm in the direction away from the axis of the mounting hole H, compared with the side wall corresponding to the portion of the mounting hole H penetrating the display panel 1; and the side wall corresponding to the portion of the mounting hole H penetrating the first protective layer 9 is retracted by 100

μm to 300 μm in the direction moving away from the axis of the mounting hole H, compared with the side walls corresponding to the portions of the mounting hole H penetrating the circular polarizer 5 and the adhesive layer 6. In this way, the side wall of the initial hole is of the step-shaped structure, and the mounting holes H is formed (referring to FIG. 4C).

For another example, two focal points of two laser beams are converged on the circular polarizer 5 and the first protective layer 9 respectively for etching, so that the side wall corresponding to the portion of the mounting hole H penetrating the circular polarizer 5 is retracted by 50 μm to 200 μm in the direction moving away from the axis of the mounting hole H, and the side wall corresponding to the portion of the mounting hole H penetrating the first protective layer 9 is retracted by 50 μm to 200 μm in the direction moving away from the axis of the mounting hole H. In this way, the side wall of the initial hole is of the protrusion-depression structure, and the mounting hole H is formed (referring to FIG. 6C).

In S600, a second light-shielding pattern 8 is formed, and the second light-shielding pattern 8 covers at least a side wall of the mounting hole H.

For example, black ink is sprayed on the side wall of the mounting hole H or an adhesive (a black hot-melt adhesive) is dispensed on the side wall of the mounting hole H to form the second light-shielding pattern 8.

In some embodiments, before S400, the method for manufacturing the display apparatus 100 further includes S310.

In S310, a second protective layer 10 is formed on a side of the display panel 1 away from the adhesive layer 6.

Based on this, in S400, the initial hole formed by punching the hole in the functional device arrangement region A2 of the display panel 1 further penetrates the second protective layer 10.

Figure 9:
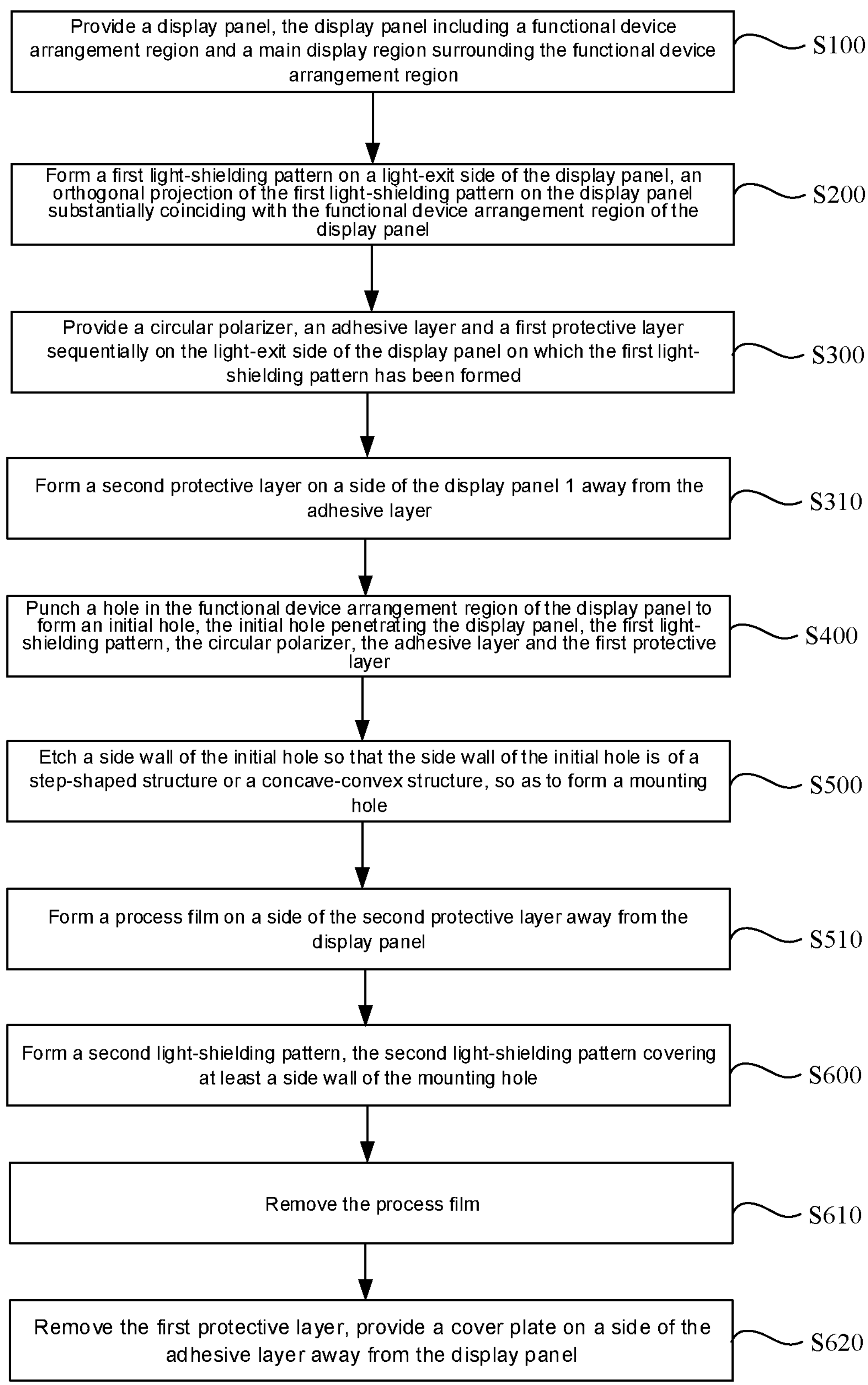
FIG. 9 is a flow diagram of another method for manufacturing a display apparatus, in accordance with some embodiments.

In some embodiments, referring to FIG. 9, before S600, the method for manufacturing the display apparatus 100 further includes S510, and after S600, the method for manufacturing the display apparatus 100 further includes S610.

In S510, a process film is formed on a side of the second protective layer 10 away from the display panel 1, so as to facilitate transfer of a semi-finished product in a subsequent process of forming the second light-shielding pattern 8, and to facilitate formation of the second light-shielding pattern 8.

In S610, the process film is removed.

In some embodiments, referring to FIG. 9, after S600, the method for manufacturing the display apparatus 100 further includes S620.

In S620, the first protective layer 9 is removed, and a cover plate 3 is provided on a side of the adhesive layer 6 away from the display panel 1.

Some embodiments of the present disclosure provide a display apparatus 100, as shown in FIGS. 4A, 5A and 6A, the display apparatus 100 includes a display module 1000 and a cover plate 3; the display module 1000 has a functional device arrangement region A2 and a main display region A1 surrounding the functional device arrangement region A2; the functional device arrangement region A2 is provided with a mounting hole H therein, and the functional device arrangement region A2 includes a reserved region A21 surrounding the mounting hole H; a side wall of the mounting hole H is of a step-shaped structure or a protrusion-depression structure.

The display module 1000 includes a display panel 1, a first light-shielding pattern 7, an adhesive layer 6 and a second light-shielding pattern 8; the first light-shielding pattern 7 is disposed on a light-exit side 01 of the display panel 1, and an orthogonal projection of the first light-shielding pattern 7 on the display panel 1 substantially coincides with the reserved region A21 of the display panel 1; the adhesive layer 6 is disposed on a side of the first light-shielding pattern 7 away from the display panel 1; the mounting hole H penetrates the display panel 1, the first light-shielding pattern 7 and the adhesive layer 6; the second light-shielding pattern 8 covers at least the side wall of the mounting hole H; the cover plate 3 is disposed on a side of the adhesive layer 6 away from the display panel 1.

In some embodiments, referring to FIGS. 4C, 5C and 6C, the mounting hole H includes a plurality of sub-holes. The plurality of sub-holes are arranged in a thickness direction of the display panel 1, and side walls of at least two adjacent sub-holes are not flush with each other.

It will be noted that, a surface of a side wall of each sub-hole is flat, and the side wall of each sub-hole may be substantially parallel to the thickness direction of the display panel 1 (referring to FIGS. 4B, 5A, 5B, 6A and 6B), or the side wall of each sub-hole may be at a certain angle to the thickness direction of the display panel 1 (referring to FIGS. 4C, 5C and 6C). In a case where the side wall of each sub-hole is at a certain angle to the thickness direction of the display panel 1, a difference between a maximum diameter and a minimum diameter of each sub-hole is in a range of 30 μm to 100 μm inclusive.

For example, as shown in FIGS. 4C, 5C and 6C, the mounting hole H includes a first sub-hole H1, a second sub-hole H2 and a third sub-hole H3. In the thickness direction of the display panel 1 and a direction from the display panel 1 to the adhesive layer 6, the first sub-hole H1, the second sub-hole H2 and the third sub-hole H3 are arranged in sequence.

Correspondingly, as shown in FIGS. 4C, 5C and 6C, the second light-shielding pattern 8 includes a first sub-pattern 81 covering a side wall S1 of the first sub-hole H1 and a second sub-pattern 82 covering a side wall S2 of the second sub-hole H2, and a third sub-pattern 83 covering a side wall S3 of the third sub-hole H3.

In some embodiments, as shown in FIG. 4C, a diameter of an end of the first sub-hole H1 proximate to the second sub-hole H2 is smaller than a diameter of an end of the second sub-hole H2 proximate to the first sub-hole H1, and the side wall S1 of the first sub-hole H1 and the side wall S2 of the second sub-hole H2 provide a stepped structure; a diameter of an end of the second sub-hole H2 proximate to the third sub-hole H3 is smaller than a diameter of an end of the third sub-hole H3 proximate to the second sub-hole H2, and the side wall S2 of the second sub-hole H2 and the side wall S3 of the third sub-hole H3 provide another stepped structure. For example, the diameter of the end of the first sub-hole H1 proximate to the second sub-hole H2 is 50 μm to 150 μm smaller than the diameter of the end of the second sub-hole H2 proximate to the first sub-hole H1, and the diameter of the end of the second sub-hole H2 proximate to the third sub-hole H3 is 50 μm to 150 μm smaller than the diameter of the end of the third sub-hole H3 proximate to the second sub-hole H2.

Correspondingly, as shown in FIG. 4C, a border of the first sub-pattern 81 proximate to the side wall S1 of the first sub-hole H1 is further close to an axis M1 of the mounting hole H relative to a border of the second sub-pattern 82 proximate to the side wall S2 of the second sub-hole H2; the border of the second sub-pattern 82 proximate to the side wall S2 of the second sub-hole H2 is further close to the axis M1 of the mounting hole H relative to a border of the third sub-pattern 83 proximate to the side wall S3 of the third sub-hole H3.

In some other embodiments, as shown in FIG. 5C, the diameter of the end of the first sub-hole H1 proximate to the second sub-hole H2 is smaller than the diameter of the end of the second sub-hole H2 proximate to the first sub-hole H1, and the side wall S1 of the sub-hole H1 and the side wall S2 of the second sub-hole H2 provide a stepped structure; the diameter of the end of the second sub-hole H2 proximate to the third sub-hole H3 is equal to the diameter of the end of the third sub-hole H3 proximate to the second sub-hole H2, and the side wall S2 of the second sub-hole H2 is flush with the side wall S3 of the third sub-hole H3. For example, the diameter of the end of the first sub-hole H1 proximate to the second sub-hole H2 is 50 μm to 150 μm smaller than the diameter of the end of the second sub-hole H2 proximate to the first sub-hole H1.

Correspondingly, as shown in FIG. 5C, the border of the first sub-pattern 81 proximate to the side wall S1 of the first sub-hole H1 is further close to the axis M1 of the mounting hole H relative to the border of the second sub-pattern 82 proximate to the side wall S2 of the second sub-hole H2; the border of the second sub-pattern 82 proximate to the side wall S2 of the second sub-hole H2 is flush with the border of the third sub-pattern 83 proximate to the side wall S3 of the third sub-hole H3.

In yet some other embodiments, as shown in FIG. 6C, the diameter of the end of the first sub-hole H1 proximate to the second sub-hole H2 is smaller than the diameter of the end of the second sub-hole H2 proximate to the first sub-hole H1, and the side wall S1 of the first sub-hole H1 and the side wall S2 of the second sub-hole H2 provide a stepped structure; the diameter of the end of the second sub-hole H2 proximate to the third sub-hole H3 is larger than the diameter of the end of the third sub-hole H3 proximate to the second sub-hole H2, and the side wall S3 of the third sub-hole H3 protrudes relative to the side wall S2 of the second sub-hole H2. For example, the diameter of the end of the first sub-hole H1 proximate to the second sub-hole H2 is 50 μm to 200 μm smaller than the diameter of the end of the second sub-hole H2 proximate to the first sub-hole H1, and the diameter of the end of the second sub-hole H2 proximate to the third sub-hole H3 is 50 μm to 200 μm larger than the diameter of the end of the third sub-hole H3 proximate to the second sub-hole H2.

Correspondingly, as shown in FIG. 6C, the border of the first sub-pattern 81 proximate to the side wall S1 of the first sub-hole H1 is further close to the axis M1 of the mounting hole H relative to the border of the second sub-pattern 82 proximate to the side wall S2 of the second sub-hole H2; the border of the second sub-pattern 82 proximate to the side wall S2 of the second sub-hole H2 is further away from the axis M1 of the mounting hole H relative to the border of the third sub-pattern 83 proximate to the side wall S3 of the third sub-hole H3.

In some embodiments, as shown in FIGS. 4A, 5A and 6A, the display module 1000 of the display apparatus 100 further includes a circular polarizer 5. The circular polarizer 5 is disposed between the display panel 1 and the adhesive layer 6, and the first light-shielding pattern 7 is located on a side of the circular polarizer 5 proximate to the display panel 1; the mounting hole H penetrates the circular polarizer 5.

The display panel 1 is provided with a plurality of inorganic films therein. Compared with organic films, the inorganic films are more fragile. During a process of punching a hole in the display panel 1, cracks are prone to be generated at edges of the holes corresponding to the inorganic films. Based on this, in some embodiments, as shown in FIGS. 4C, 5C and 6C, the first sub-hole H1 penetrates the display panel 1 and the first light-shielding pattern 7, the second sub-hole H2 penetrates the circular polarizer 5, and the third sub-hole H3 penetrates the adhesive layer 6.

In this case, the display panel 1 need to be punched only once, and there is no need to cut the side wall of the sub-hole corresponding to the display panel 1, so that a risk of generating cracks at an edge of the sub-hole corresponding to the display panel 1 may be reduced, and a width of the reserved region A21 of the display panel 1 may be designed to be small.

It will be noted that, in the embodiments of the present disclosure, a film layer that the first sub-hole H1, the second sub-hole H2 and the third sub-hole H3 penetrate respectively are not limited thereto.

In some embodiments, referring to FIGS. 4C, 5C and 6C, the second light-shielding pattern 8 includes a fourth sub-pattern 84, and the fourth sub-pattern 84 covers a portion of a surface of the adhesive layer 6 away from the display panel 1 that exceeds the first protective layer 9; a surface of the cover plate 3 proximate to the display panel 1 is in contact with a surface of the fourth sub-pattern 84.

Here, an orthogonal projection of the fourth sub-pattern 84 on the display panel 1 is located within the reserved region A21 of the display panel 1; alternatively, the orthogonal projection of the fourth sub-pattern 84 on the display panel 1 substantially coincides with the reserved region A21 of the display panel 1.

In this case, since the fourth sub-pattern 84 is further adhered to the adhesive layer 6 over a large area, during a process of peeling off the first protective layer 9 on the adhesive layer 6 in a manufacturing process of the display apparatus 100, it is possible to reduce a risk of picking at a contact position between the first protective layer 9 and the fourth sub-pattern 84, and facilitate the peeling off.

In addition, the fourth sub-pattern 84 may further shield cracks at edges in the reserved region A21 of sub-holes on a side of the first light-shielding pattern 7 away from the display panel 1, and further reduce the risk of light leakage.

In a process of forming the fourth sub-pattern 84, the fourth sub-pattern 84 is integrally formed with a portion of the second light-shielding pattern 8 that covers the side wall of the mounting hole H, so that processes may be simplified, and manufacturing costs may be reduced.

In some embodiments, as shown in FIGS. 4A, 5A and 6A, the display module 1000 of the display apparatus 100 further includes a second protective layer 10. The second protective layer 10 is disposed on a side of the display panel 1 away from the adhesive layer 6, and the mounting hole H penetrates the second protective layer 10.

Based on this, referring to FIGS. 4C, 5C and 6C, the mounting hole H further includes a fifth sub-hole H5 penetrating the second protective layer 10. A diameter of an end of the fifth sub-hole H5 proximate to the sub-hole H1 is equal to a diameter of an end of the sub-hole H1 proximate to the fifth sub-hole H5, and a side wall S5 of the fifth sub-hole H5 is flush with the side wall S1 of the first sub-hole H1.

Correspondingly, referring to FIGS. 4C, 5C and 6C, the second light-shielding pattern further includes a fifth sub-pattern 85 covering the side wall S5 of the fifth sub-hole.

In some embodiments, as shown in FIGS. 4A, 5A and 6A, a surface of the second light-shielding pattern 8 proximate to the axis M1 of the mounting hole H is flat, so as to reduce undesirable interference to external light received by an opening at an end of the second light-shielding pattern 8 that corresponds to a display side of the display panel 1, and to ensure that more external light may enter the functional device through the mounting hole H.

In addition, the surface of the second light-shielding pattern 8 proximate to the axis of the mounting hole H is substantially parallel to the axis of the mounting hole H. That is to say, an inner diameter of the second light-shielding pattern 8 is approximately equal, and most of the external light received by the opening at the end of the second light-shielding pattern 8 that corresponds to the display side of the display panel 1 may enter the functional device through the mounting hole H. In this way, it is possible to ensure that sufficient external light may enter the functional device through the mounting hole H in a case where the functional device arrangement region A2 occupies a small part of a display area.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module having a functional device arrangement region and a main display region surrounding the functional device arrangement region; wherein the functional device arrangement region is provided with a mounting hole therein, and the functional device arrangement region includes a reserved region surrounding the mounting hole; a side wall of the mounting hole is of one of a step-shaped structure and a protrusion-depression structure;

the display module comprises:

a display panel;

a first light-shielding pattern disposed on a light-exit side of the display panel, an orthogonal projection of the first light-shielding pattern on the display panel substantially coinciding with the reserved region of the display panel;

an adhesive layer disposed on a side of the first light-shielding pattern away from the display panel, the mounting hole penetrating the display panel, the first light-shielding pattern and the adhesive layer;

a second light-shielding pattern covering at least the side wall of the mounting hole and a portion of a surface of the first light-shielding pattern away from the display panel, the first light-shielding pattern being connected to the second light-shielding pattern; and a circular polarizer disposed between the display panel and the adhesive layer, the first light-shielding pattern being located on a side of the circular polarizer proximate to the display panel, the circular polarizer being directly connected to the display panel and the first light-shielding pattern, and the mounting hole further penetrating the circular polarizer.

2. The display module according to claim 1, wherein the mounting hole includes a plurality of sub-holes, the plurality of sub-holes are arranged in a thickness direction of the display panel, and side walls of at least two adjacent sub-holes are not flush with each other.

3. The display module according to claim 2, wherein the mounting hole includes a first sub-hole, a second sub-hole and a third sub-hole; in a direction from the display panel to the adhesive layer, the first sub-hole, the second sub-hole and the third sub-hole are arranged in sequence;

a diameter of an end of the first sub-hole proximate to the second sub-hole is smaller than a diameter of an end of the second sub-hole proximate to the first sub-hole, and a side wall of the first sub-hole and a side wall of the second sub-hole provide a stepped structure; and a diameter of an end of the second sub-hole proximate to the third sub-hole is smaller than a diameter of an end of the third sub-hole proximate to the second sub-hole, and the side wall of the second sub-hole and a side wall of the third sub-hole provide another stepped structure, the stepped structure and the another stepped structure constitute at least part of the step-shaped structure; or the diameter of the end of the second sub-hole proximate to the third sub-hole is equal to the diameter of the end of the third sub-hole proximate to the second sub-hole, and the side wall of the second sub-hole is flush with the side wall of the third sub-hole, the stepped structure and the side walls of the second sub-hole and the third sub-hole constitute at least part of the step-shaped structure; or the diameter of the end of the second sub-hole proximate to the third sub-hole is larger than the diameter of the end of the third sub-hole proximate to the second sub-hole, and the side wall of the third sub-hole protrudes relative to the side wall of the second sub-hole, the stepped structure and the side walls of the second sub-hole and the third sub-hole constitute at least part of the protrusion-depression structure.

4. The display module according to claim 3, wherein the second light-shielding pattern includes a first sub-pattern covering the side wall of the first sub-hole, a second sub-pattern covering the side wall of the second sub-hole, and a third sub-pattern covering the side wall of the third sub-hole;

a border of the first sub-pattern proximate to the side wall of the first sub-hole is further close to an axis of the mounting hole relative to a border of the second sub-pattern proximate to the side wall of the second sub-hole; and in a case where the diameter of the end of the second sub-hole proximate to the third sub-hole is smaller than the diameter of the end of the third sub-hole proximate to the second sub-hole, the border of the second sub-pattern proximate to the side wall of the second sub-hole is further close to the axis of the mounting hole relative to a border of the third sub-pattern proximate to the side wall of the third sub-hole; or in a case where the diameter of the end of the second sub-hole proximate to the third sub-hole is equal to the diameter of the end of the third sub-hole proximate to the second sub-hole, the border of the second sub-pattern proximate to the side wall of the second sub-hole is flush with the border of the third sub-pattern proximate to the side wall of the third sub-hole; or in a case where the diameter of the end of the second sub-hole proximate to the third sub-hole is larger than the diameter of the end of the third sub-hole proximate to the second sub-hole, the border of the second sub-pattern proximate to the side wall of the second sub-hole is further away from the axis of the mounting hole relative to the border of the third sub-pattern proximate to the side wall of the third sub-hole.

5. The display module according to claim 3, wherein the first sub-hole penetrates the display panel and the first light-shielding pattern, the second sub-hole penetrates the circular polarizer, and the third sub-hole penetrates the adhesive layer.

6. The display module according to claim 5, further comprising:

a first protective layer disposed on a side of the adhesive layer away from the display panel; wherein the mounting hole further includes a fourth sub-hole penetrating the first protective layer; a diameter of an end of the fourth sub-hole proximate to the third sub-hole is larger than a diameter of an end of the third sub-hole proximate to the fourth sub-hole, and a side wall of the fourth sub-hole and the side wall of the third sub-hole provide another stepped structure.

7. The display module according to claim 6, wherein the second light-shielding pattern further includes a fourth sub-pattern, the fourth sub-pattern covers at least a portion of a surface of the adhesive layer away from the display panel that exceeds the first protective layer.

8. The display module according to claim 7, wherein the fourth sub-pattern and a portion, except the fourth sub-pattern, of the second light-shielding pattern that covers the side wall of the mounting hole are disposed as an integral structure; and/or an orthogonal projection of the fourth sub-pattern on the display panel is located within the reserved region of the display panel, or substantially coincides with the reserved region of the display panel.

9. The display module according to claim 3, further comprising:

a second protective layer disposed on a side of the display panel away from the adhesive layer; wherein the mounting hole further includes a fifth sub-hole penetrating the second protective layer; a diameter of an end of the fifth sub-hole proximate to the first sub-hole is equal to a diameter of an end of the first sub-hole proximate to the fifth sub-hole, and a side wall of the fifth sub-hole is flush with the side wall of the first sub-hole; or the display module further comprising:

a second protective layer disposed on a side of the display panel away from the adhesive layer; wherein the mounting hole further includes a fifth sub-hole penetrating the second protective layer; a diameter of an end of the fifth sub-hole proximate to the first sub-hole is equal to a diameter of an end of the first sub-hole proximate to the fifth sub-hole, and a side wall of the fifth sub-hole is flush with the side wall of the first sub-hole; the second light-shielding pattern further includes a fifth sub-pattern covering the side wall of the fifth sub-hole.

10. The display module according to claim 1, wherein a surface of the second light-shielding pattern proximate to an axis of the mounting hole is flat; or the surface of the second light-shielding pattern proximate to the axis of the mounting hole is flat, and the surface of the second light-shielding pattern proximate to the axis of the mounting hole is substantially parallel to the axis of the mounting hole.

11. The display module according to claim 1, wherein a material of the first light-shielding pattern and the second light-shielding pattern is black ink or a black hot melt adhesive.

12. A method for manufacturing a display apparatus, the manufacturing method comprising:

providing a display panel, the display panel including a functional device arrangement region and a main display region surrounding the functional device arrangement region;

forming a first light-shielding pattern on a light-exit side of the display panel, an orthogonal projection of the first light-shielding pattern on the display panel substantially coinciding with the functional device arrangement region of the display panel;

providing a circular polarizer, an adhesive layer and a first protective layer sequentially on the light-exit side of the display panel on which the first light-shielding pattern has been formed;

punching a hole in the functional device arrangement region of the display panel to form an initial hole, the initial hole penetrating the display panel, the first light-shielding pattern, the circular polarizer, the adhesive layer and the first protective layer, wherein the first light-shielding pattern is located on a side of the circular polarizer proximate to the display panel, and the circular polarizer is directly connected to the display panel and the first light-shielding pattern;

etching a side wall of the initial hole so that the side wall of the initial hole is of one of a step-shaped and a protrusion-depression structure, so as to form a mounting hole; and forming a second light-shielding pattern, the second light-shielding pattern covering at least a side wall of the mounting hole and a portion of a surface of the first light-shielding pattern away from the display panel, the first light-shielding pattern being connected to the second light-shielding pattern.

13. The manufacturing method according to claim 12, wherein etching the side wall of the initial hole so that the side wall of the initial hole is of the one of the step-shaped and the protrusion-depression structure, so as to form the mounting hole includes:

etching the display panel, the circular polarizer, the adhesive layer and the first protective layer for multiple times by using a laser beam, so that the side wall of the initial hole is of the one of the step-shaped and the protrusion-depression structure; or converging at least two focal points of at least two laser beams on at least two of the display panel, the circular polarizer, the adhesive layer and the first protective layer respectively, and etching the display panel, the circular polarizer, the adhesive layer and the first protective layer synchronously by using the at least two laser beams, so that the side wall of the initial hole is of the one of the step-shaped and the protrusion-depression structure.

14. The manufacturing method according to claim 12, wherein before punching the hole in the functional device arrangement region of the display panel, the manufacturing method further comprises: forming a second protective layer on a side of the display panel away from the adhesive layer; wherein the initial hole formed by punching the hole in the functional device arrangement region of the display panel further penetrates the second protective layer.

15. The manufacturing method according to claim 14, wherein before forming the second light-shielding pattern, the manufacturing method further comprises:

forming a process film on a side of the second protective layer away from the display panel; and after forming the second light-shielding pattern on the side wall of the mounting hole, the manufacturing method further comprises:

removing the process film.

16. The manufacturing method according to claim 12, wherein after forming the second light-shielding pattern, the manufacturing method further comprises:

removing the first protective layer; and providing a cover plate on a side of the adhesive layer away from the display panel.

17. A display apparatus, comprising:

a display module having a functional device arrangement region and a main display region surrounding the functional device arrangement region; wherein the functional device arrangement region is provided with a mounting hole therein, and the functional device arrangement region includes a reserved region surrounding the mounting hole; a side wall of the mounting hole is of one of a step-shaped and a protrusion-depression structure; the display module includes:

a display panel;

a first light-shielding pattern disposed on a light-exit side of the display panel, an orthogonal projection of the first light-shielding pattern on the display panel substantially coinciding with the reserved region of the display panel;

an adhesive layer disposed on a side of the first light-shielding pattern away from the display panel, the mounting hole penetrating the display panel, the first light-shielding pattern and the adhesive layer;

a second light-shielding pattern covering at least the side wall of the mounting hole and a portion of a surface of the first light-shielding pattern away from the display panel, the first light-shielding pattern being connected to the second light-shielding pattern; and a circular polarizer disposed between the display panel and the adhesive layer, the first light-shielding pattern being located on a side of the circular polarizer proximate to the display panel, the circular polarizer being directly connected to the display panel and the first light-shielding pattern, and the mounting hole further penetrating the circular polarizer; and a cover plate disposed on a side of the adhesive layer away from the display panel.

18. The display apparatus according to claim 17, wherein the second light-shielding pattern includes a fourth sub-pattern, the fourth sub-pattern covers at least a portion of a surface of the adhesive layer away from the display panel that exceeds the first protective layer;

a surface of the cover plate proximate to the display panel is in contact with a surface of the fourth sub-pattern.

19. The display apparatus according to claim 17, wherein the display module further includes:

a second protective layer disposed on a side of the display panel away from the adhesive layer, the mounting hole further penetrating the second protective layer.

* * * * *